United States Patent [19]

Matsuoka et al.

[11] Patent Number: 5,362,241
[45] Date of Patent: * Nov. 8, 1994

[54] CONTACTOR FOR ELECTRIC PART

[75] Inventors: Noriyuki Matsuoka; Toru Takahashi, both of Yokohama, Japan

[73] Assignee: Yamaichi Electronics Co., Ltd., Tokyo, Japan

[*] Notice: The portion of the term of this patent subsequent to Mar. 9, 2010 has been disclaimed.

[21] Appl. No.: 115,262

[22] Filed: Sep. 2, 1993

Related U.S. Application Data

[62] Division of Ser. No. 991,964, Dec. 17, 1992, abandoned.

[30] Foreign Application Priority Data

Dec. 26, 1991 [JP]  Japan ................... 3-359648

[51] Int. Cl.$^5$ ............................... H01R 9/09
[52] U.S. Cl. ...................... 439/66; 439/83; 439/591
[58] Field of Search .............. 439/66, 71, 76, 81, 439/482, 591, 851, 856, 852, 83, 265

[56] References Cited

U.S. PATENT DOCUMENTS

| | | | |
|---|---|---|---|
| 4,508,405 | 4/1985 | Damon et al. | 439/66 |
| 4,636,026 | 1/1987 | Cooney et al. | 439/482 |
| 4,838,801 | 6/1989 | Bertoglio et al. | 439/482 |
| 4,904,213 | 2/1990 | Hock et al. | 439/482 |
| 5,151,040 | 9/1992 | Tanaka | 439/73 |
| 5,174,763 | 12/1992 | Wilson | 439/66 |
| 5,192,213 | 3/1993 | Kosugi et al. | 439/83 |
| 5,215,472 | 6/1993 | DelPrete et al. | 439/331 |

FOREIGN PATENT DOCUMENTS 63-25467  2/1988  Japan .

*Primary Examiner*—Larry I. Schwartz
*Assistant Examiner*—Hien D. Vu
*Attorney, Agent, or Firm*—Wenderoth, Lind & Ponack

[57] ABSTRACT

A contactor for an electric part comprises a plurality of pressure bearing elements connected at one ends thereof and extending in opposed relation to each other. The other ends are left as free ends. A movable contactor has a press contacting portion formed at a connection end of the pressure bearing elements. The press contacting portion is pushed up by the elastic force stored by the pressure bearing elements, which are closed or opened against the elasticity thereof, thereby obtaining a contact pressure with a contact of an electric part.

18 Claims, 11 Drawing Sheets

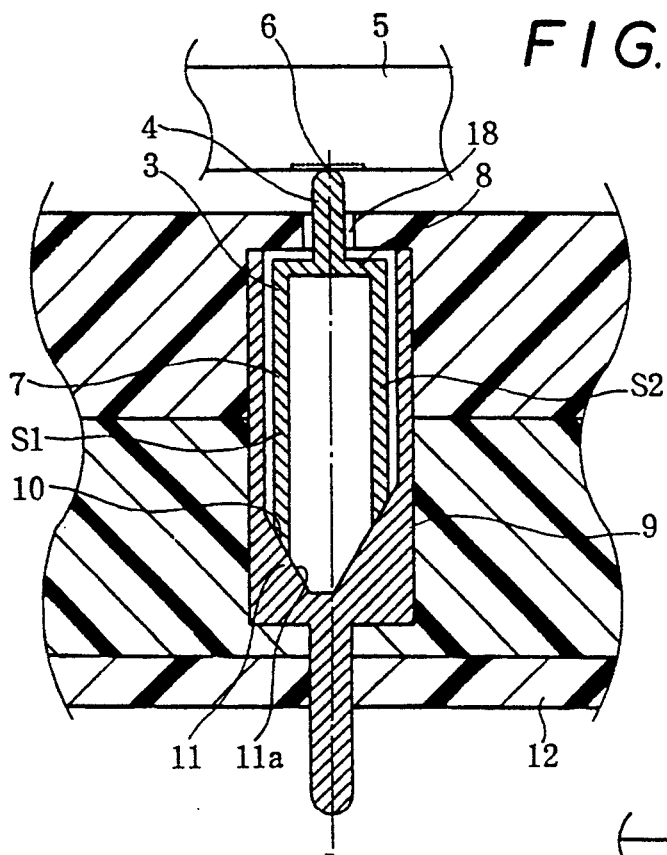
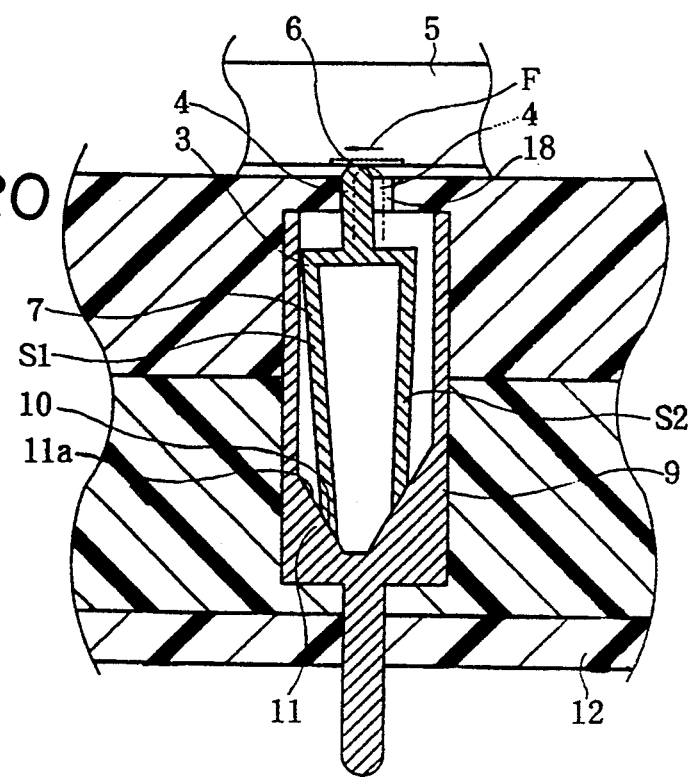

CONTACTOR FOR ELECTRIC PART

This application is a Division of now abandoned application, Ser. No. 07/991,964, filed on Dec. 17, 1992, now abandoned.

BACKGROUND OF THE INVENTION

1. Field of the Invention

This invention relates to a contactor for an electric part, suitable for press contacting with an electric part such as an IC having a plurality of contacts.

2. Description of the Prior Art

In a conventional contactor of this type, as disclosed in Japanese Utility Model Early Laid-Open Publication No. Sho 68-25467, a contactor main body comprises a movable contactor to be press contacted with an electric part elastically held by one end of a coil spring. The other end of the coil spring is supported by a stationary contactor, the movable contactor being pushed down by the electric part to compress the coil spring so that the movable contactor is elastically press contacted with the electric part by the elastic force thereof.

This movable contactor is linearly moved on its axis by the elastic force of the coil spring to realize the press contact.

However, the contactor thus constructed has problems in that, since the coil spring is interposed between the movable contactor and the stationary contactor as a means for press contacting the movable contactor to the contact of the electric part, the coil spring must be prepared as a separate part, and therefore the number of parts is increased, increasing the cost, and the reliability is low because the coil spring is disposed at a signal line.

It also has problems in that since the movable contactor moves on the axis of the coil spring merely to be press contacted with the contact of the electric part, in the case where a press contacting surface of the movable contactor or an abutment surface of the contact of the electric part is covered with an oxide film, contact between the movable contactor and the contact of the electric part becomes unstable, and therefore the reliability is low.

SUMMARY OF THE INVENTION

It is therefore a general object of the present invention to provide a contactor for an electric part capable of effectively solving the above problems.

A specific object of the invention is to provide a contactor for an electric part in which a sufficient contacting pressure with a contact of an electric part such as a conductive pad can be obtained without using the above-mentioned spring.

A further object of the present invention is to provide a contactor for an electric part in which a highly reliable contact relation between a contact of an electric part such as a conductive pad and a movable contactor can be obtained by positively removing an oxide film formed on the contacting surfaces.

From one aspect of the present invention, a contactor for an electric part comprises a movable contactor having a press contacting portion and elastic pressure bearing elements extending in parallel relation with the movable contactor. A pressing portion adapted to press the pressure bearing elements is formed on a stationary contactor held by a substrate, or on the substrate itself. The pressure bearing elements, when the press contacting portion is pushed down by a contact of the electric part, are closed or opened against the elasticity thereof by the pressing portion so as to be press contacted with the contact of the electric part by the restoring force stored in the pressure bearing elements.

From another aspect of the present invention, a contactor for an electric part comprises a movable contactor having a press contacting portion, a pressing portion formed on the movable contactor, a stationary contactor, and elastic pressure bearing elements extending in parallel relation with the stationary contactor. The pressing portion, when the press contacting portion is pushed down by contact of the electric part, closes or opens the pressure bearing elements against the elasticity thereof so as to be press contacted with the contact of the electric part by the restoring force stored in the pressure bearing elements.

From a further aspect of the present invention, a contactor for an electric part comprises a movable contactor and a press contacting portion disposed at a location eccentric to a moving axis of the movable contactor. The press contacting portion, when pushed down by contact of the electric part, is press contacted with the contact of the electric part by the restoring force stored in pressure bearing elements, and the movable contactor is tilted to generate friction between the press contacting portion and the contact of the electric part.

According to the present invention, when the movable contactor is pushed down by the electric part placed on the press contacting portion, the pressure bearing elements of the movable contactor are bent by the pressing portion in such a manner as to be closed or opened against their elasticity, and the press contacting portion is caused to push up the contact of the electric part by the elastic force stored in the pressure bearing elements, thereby achieving a proper press contact. Accordingly, there can be provided a highly reliable contactor for an electric part, without using a coil spring as in the prior art. In addition, the number of parts can be reduced, and the cost can be reduced, too.

According to the present invention, along with the above-mentioned function, the press contacting portion is properly contacted with the contact of the electric part by the elastic force stored in the pressure bearing elements of the movable contactor, and the movable contactor is tilted to generate friction with the contact. By means of this friction, the oxide film covering the contacting surfaces of them can be favorably removed. As a consequence, a clean contact between the press contacting portion and the electric part can be obtained.

BRIEF DESCRIPTION OF THE DRAWINGS

The above and other objects, and features of the present invention will become more manifest to those skilled in the art upon a reading of the following description, taken in connection with the accompanying drawings, wherein:

FIG. 19 is a sectional view of an important part of a connector incorporated with a contactor for an electric part according to a tenth embodiment of the present invention;

FIG. 20 is a sectional view of the tenth embodiment, showing a press contacted state with the electric part;

DETAILED DESCRIPTION OF THE EMBODIMENT

Figure 1:
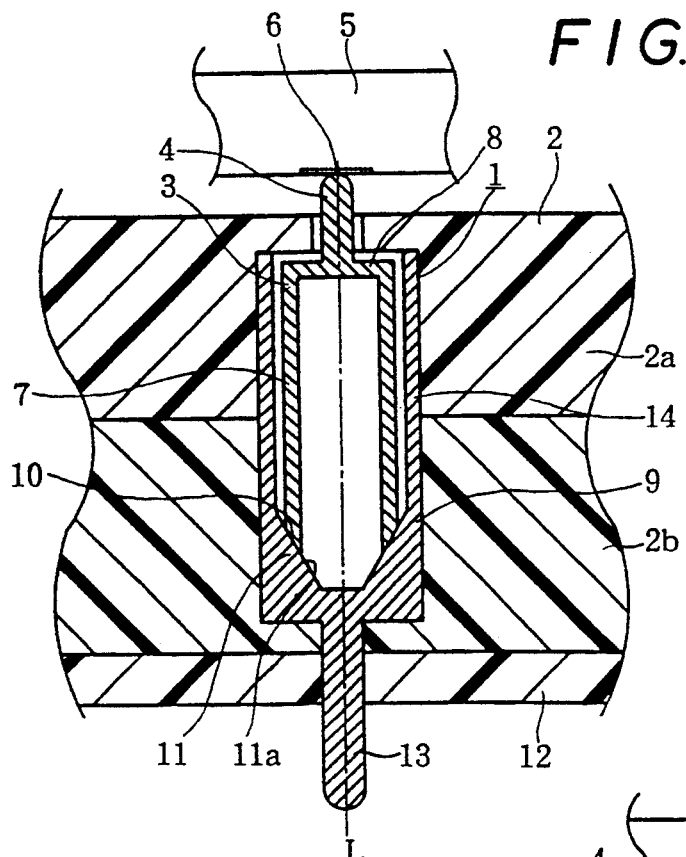
FIG. 1 is a sectional view of an important part of a connector incorporated with a contactor for an electric part according to a first embodiment of the present invention.
Figure 2:
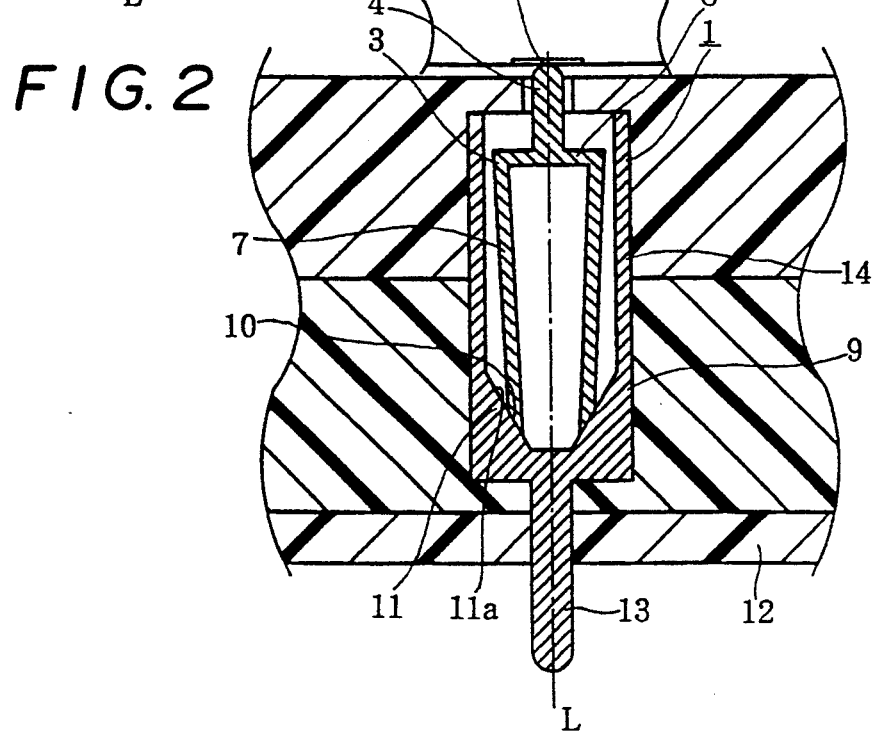
FIG. 2 is a sectional view of the first embodiment, showing a press contacted state with the electric part.

Several embodiments of the present invention will now be described in detail with reference to FIGS. 1 through 22 inclusive FIGS. 1 and 2 show a first embodiment of the present invention, FIGS. 3 and 4, a second embodiment, FIGS. 5 and 6, a third embodiment, FIGS. 7 and 8, a fourth embodiment, FIGS. 9 and 10, a fifth embodiment, FIGS. 11 and 12, a sixth embodiment, FIGS. 13 and 14, a seventh embodiment, FIGS. 15 and 16, an eighth embodiment, FIGS. 17 and 18, a ninth embodiment, FIGS. 19 and 20, a tenth embodiment, and FIGS. 21 and 22, an eleventh embodiment, respectively.

The first to fifth embodiments exemplify a contactor for an electric part in which a press contacting portion is pushed up by an elastic restoring force of pressure bearing elements disposed at a movable contactor so as to be press contacted with a contact of an electric part. The sixth embodiment exemplifies a contactor for an electric part in which a pressure bearing portion is disposed at a stationary contactor. The seventh to eleventh embodiments exemplify a contactor for an electric part in which, in the above embodiments, friction is generated between the press contacting portion and the contact of the electric part.

FIGS. 1, 3, 5, 7, 9, and 11 show a state where an electric part 5 is placed on and contacted with a press contacting portion 4 of a movable contactor 3 projecting from a substrate surface of an insulating substrate 2 with a contactor 1 disposed therein, while FIGS. 2, 4, 6, 8, 10, and 12 show a state where the press contacting portion 4 is press contacted with a contact 6, for example, a conductive pad, of the electric part 5.

The movable contactor 3 has a plurality of pressure bearing elements 7 extending in opposing parallel relation and in equal length with each other. The opposing pressure bearing elements 7 are connected with each other at one end, and the other ends are left as free ends. The movable contactor 3 is further provided with the press contacting portion 4 projecting in the opposite direction with respect to the extending direction of the pressure bearing elements 7 from the center of the connection portion 8, i.e. on a moving axis L of the movable contactor 3.

Owing to the above arrangement, the pressure bearing elements 7 can be opened and closed about the connection portion 8 at one end thereof against their elasticity, and the press contacting portion 4 is pushed along on the axis L by the restoring force of the pressure bearing elements 7 so as to be press contacted with the contact 6 of the electric part 5.

Specifically, the movable contactor 3 is provided with tapered portions 10 formed on end faces of the free end portions of the pressure bearing elements 7 respectively. For example, in order to close the pressure bearing elements 7 against their elasticity, the tapered portions 10 are formed in such a manner as to be converged inwardly with respect to the axis L of the movable contactor 3 as shown in FIGS. 1, 2, 5, 6, 9, 10, 11, and 12. On the other hand, in order to open the pressure bearing elements 7, the tapered portions 10 are formed in such a manner as to be diverged outwardly with respect to the axis L of the movable contactor 3.

The contactor 1 for an electric part is provided with a pressing portion 11 formed in such a manner as to be opposite to end portions of the pressure bearing elements 7 of the movable contactor 3. For example, as shown in FIGS. 1, 2 and others, the pressing portion 11 is formed in such a manner as to be opposite to the tapered portions 10, and has an inclination surface 11a of a generally complementary angle with the tapered portions 10. In the above embodiments where the pressure bearing elements 7 are closed against their elasticity, the inclination surface 11a of the pressing portion 11 is gradually inclined inwardly in the push-in direction of the movable contactor 3. In other words, the inclination surface 11a having a reversed cone shape is formed in such a manner as to be opposite to the tapered portions 10. Upon pushing in the movable contactor 3, the tapered portions 10 of the pressure bearing elements 7, while abutting with the inclination surface 11a of the pressing portion 11, are pushed inwardly to close the pressure bearing elements 7 against their elasticity, and the movable contactor 3 is pushed up along the axis L by the elastic restoring force in the opening direction of the pressure bearing elements 7.

In the above embodiment where the pressure bearing elements 7 are opened against their elasticity of the pressure bearing elements 7, the inclination surface 11a of the pressing portion 11 is inclined in such a manner as to be gradually divergent in the push-in direction of the movable contactor 3. Upon pushing of the movable contactor 3, the tapered portions 10 of the pressure bearing elements 7, while abutting with the inclination surface 11a of the pressing portion 11, are pushed outwardly to permit the pressure bearing elements 7 to be opened, and the movable contactor 3 is pushed up along the axis L by the elastic restoring force in the closing direction of the pressure bearing elements 7.

Figure 3:
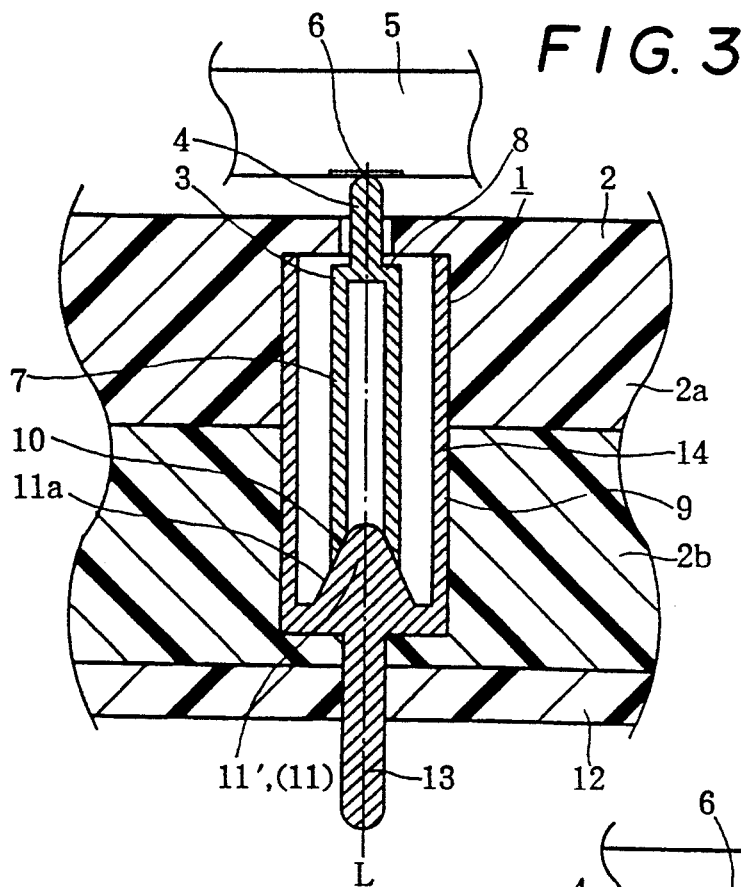
FIG. 3 is a sectional view of an important part of a connector incorporated with a contactor for an electric part according to a second embodiment of the present invention.
Figure 4:
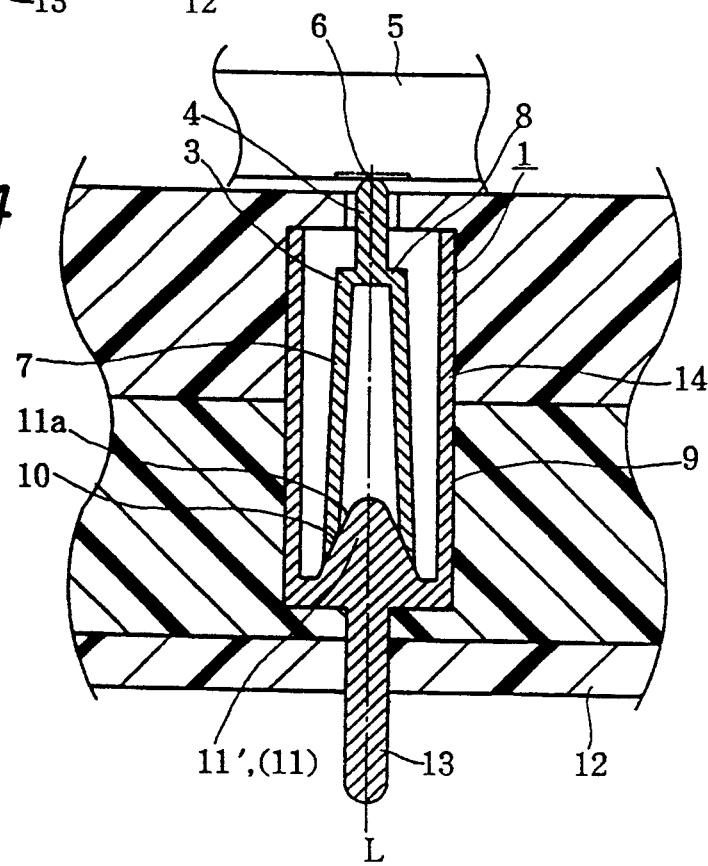
FIG. 4 is a sectional view of the second embodiment, showing a press contacted state with the electric part.

In FIGS. 3 and 4, a cone-shaped protrusion 11' is formed as the pressing portion in such a manner as to be opposite to the tapered portions 10, and the protrusion 11' is interposed between the pressure bearing elements 7 in order to open them.

Figure 5:
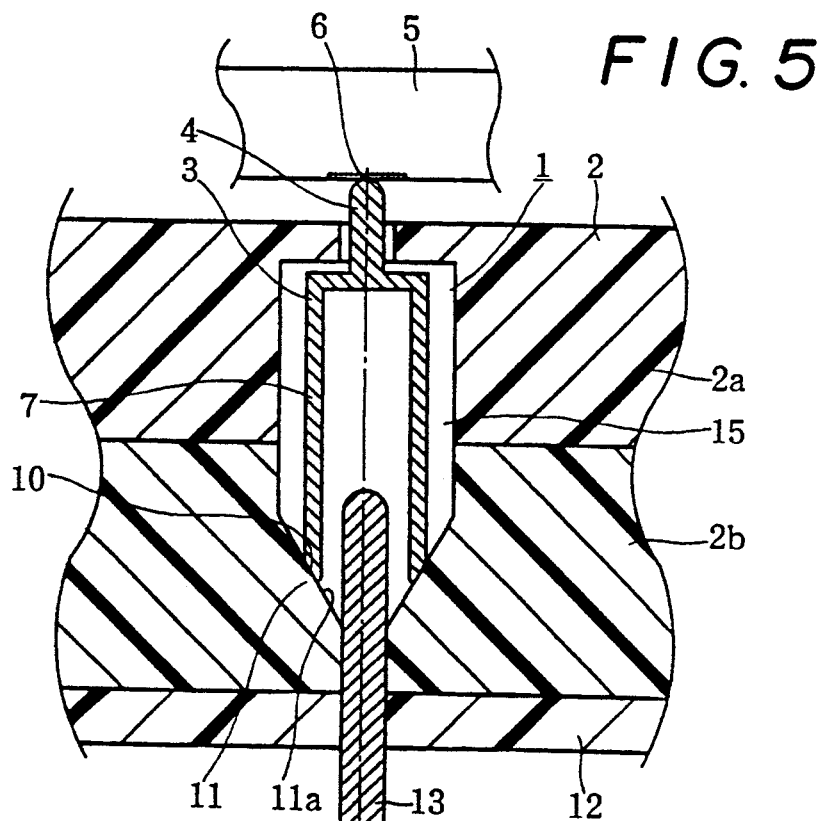
FIG. 5 is a sectional view of an important part of a connector incorporated with a contactor for an electric part according to a third embodiment of the present invention.
Figure 6:
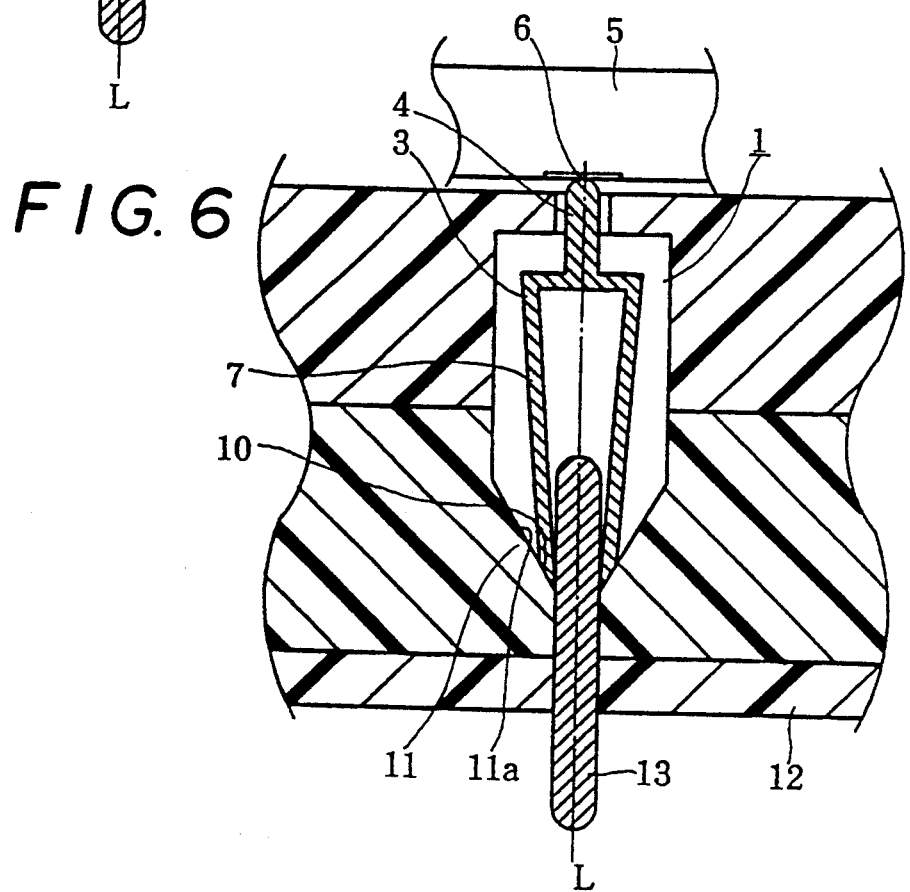
FIG. 6 is a sectional view of the third embodiment, showing a press contacted state with the electric part.
Figure 7:
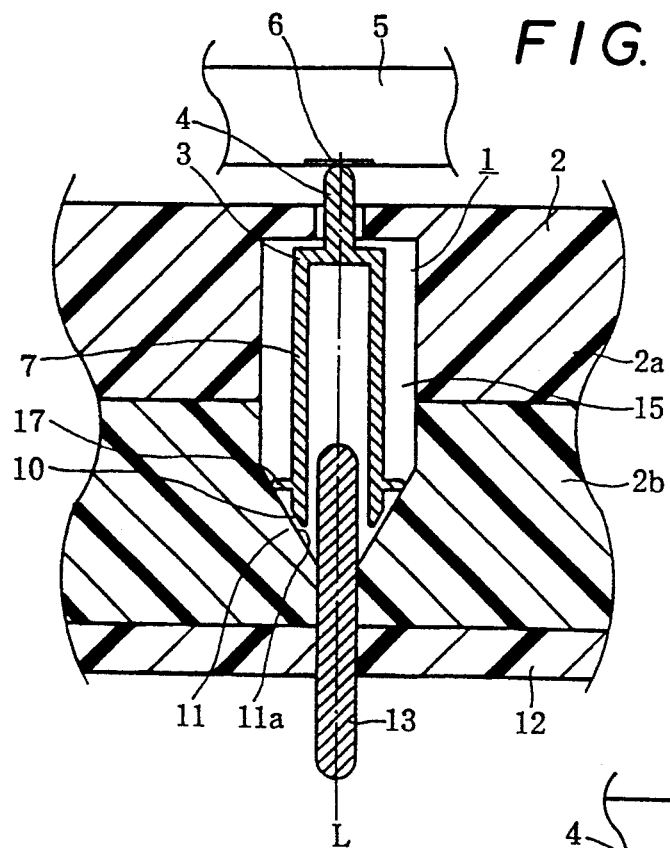
FIG. 7 is a sectional view of an important part of a connector incorporated with a contactor for an electric part according to a fourth embodiment of the present invention.

The pressing portion 11 is formed on an inner wall of a contactor holding hole 15 formed in the insulating substrate as shown in FIGS. 5 through 7, or otherwise the pressing portion 11 is formed on a stationary contactor 9 held within the contactor holding hole 15 as shown in FIGS. 1 through 4. That is, in FIGS. 1 through 4, the stationary contactor 9 is formed of a cylindrical member 14 having a bottom, and the movable contactor 3 is received within the cylindrical member 14, with the press contacting portion 4 allowed to project from an opening portion of the cylindrical member 14. The cylindrical member 14 is provided at an inner bottom portion thereof with the pressing portion 11 formed of the inclination surface 11a, and the pressing portion 11 is formed in such a manner as to be opposite to the tapered portions 10.

As shown in FIGS. 5 and 6, the pressing portion 11 having the reversed cone-shaped inclination surface 11a is formed by a wall forming an opening at the inner bottom portion of the contactor holding hole 15, and the pressing portion 11 is formed in such a manner as to be opposite to the tapered portions 10 of the pressing portion 11.

Figure 8:
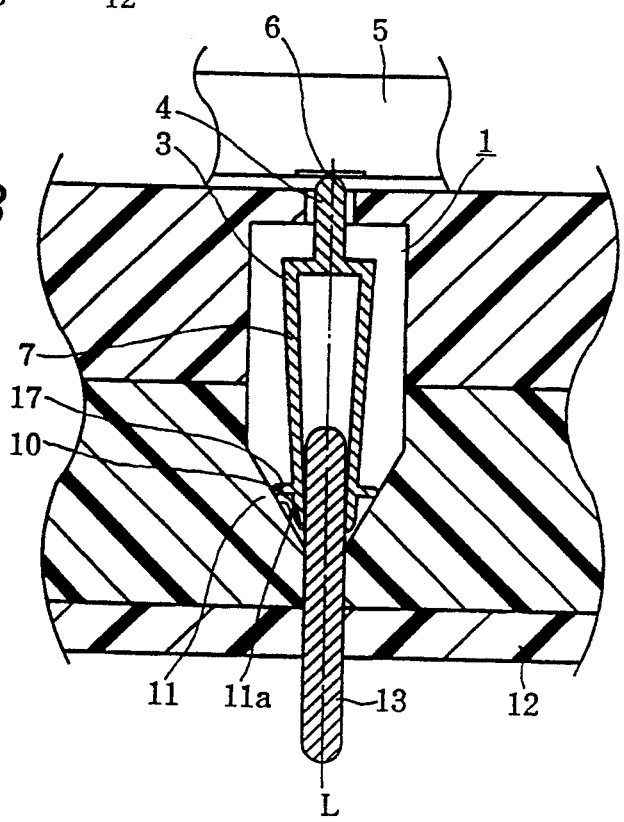
FIG. 8 is a sectional view of the fourth embodiment, showing a press contacted state with the electric part.

In FIGS. 7 and 8, the contactor holding hole 15 is provided at an inner bottom portion thereof with the pressing portion 11 having a reversed cone-shaped inclination surface 11a, and the pressure bearing elements 7 are provided with projections 17 projecting sidewards. Upon pushing of the movable contactor 3, the projections 17 are pushed by the inclination surface 11a of the pressing portion 11 in order to close the pressure bearing elements 7 against their elasticity.

As shown in FIGS. 5 through 7, in the case where the pressing portion 11 is formed on the inner wall of the contactor holding hole 15, a male terminal 13 is implanted in the bottom portion of the contactor holding hole 15. An upper end of the male terminal 13 is disposed between the pressure bearing elements 7 within the contactor holding hole 15, and a lower end thereof is allowed to project downward from the substrate so as to be connected to a wiring board 12, etc.

The pressure bearing elements 7 shown in FIGS. 5 through 8 are closed by the pressing portion 11 to store ascending elasticity when the movable contactor 3 is pushed down by the contact 6 of the electric part 5. At the same time, the male terminal 13 is held between the pressure bearing elements 7 in order to create a conductive state between the movable contactor 3 and the male terminal 13.

Figure 9:
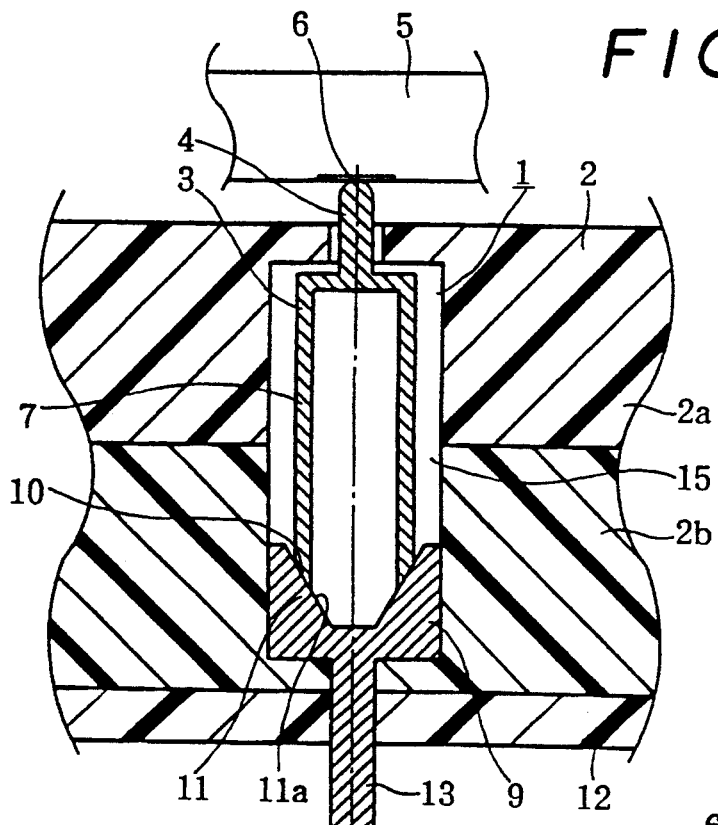
FIG. 9 is a sectional view of an important part of a connector incorporated with a contactor for an electric part according to a fifth embodiment of the present invention.
Figure 10:
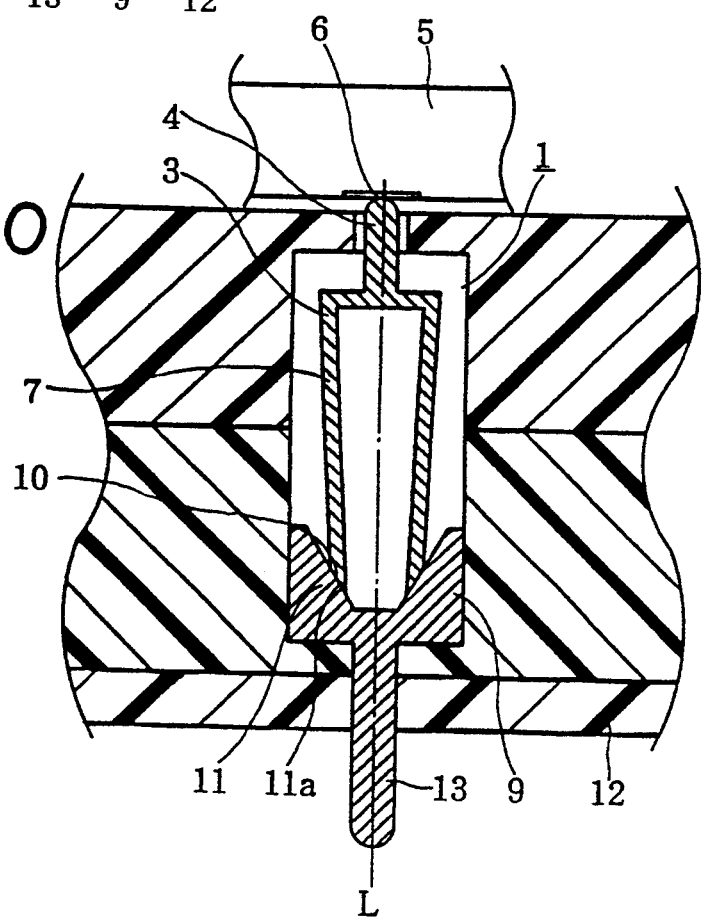
FIG. 10 is a sectional view of the fifth embodiment, showing a press contacted state with the electric part.

In FIGS. 9 and 10, the movable contactor 3 is disposed within the contactor holding hole 15 formed in the insulating substrate, and the stationary contactor 9 adapted to contact with the contactor 3 is disposed at the inner bottom portion of the contactor holding hole 15. The stationary contactor 9 is provided with the pressing portion 11 in the same manner as in FIGS. 1 and 2, and the inclination surface 11a of the pressing portion 11 is formed in such a manner as to be opposite to the tapered portions 10 of the pressure bearing elements 7. The stationary contactor 9 of this embodiment does not have the cylindrical member for receiving the movable contactor 3 as in FIGS. 1 and 2.

Figure 11:
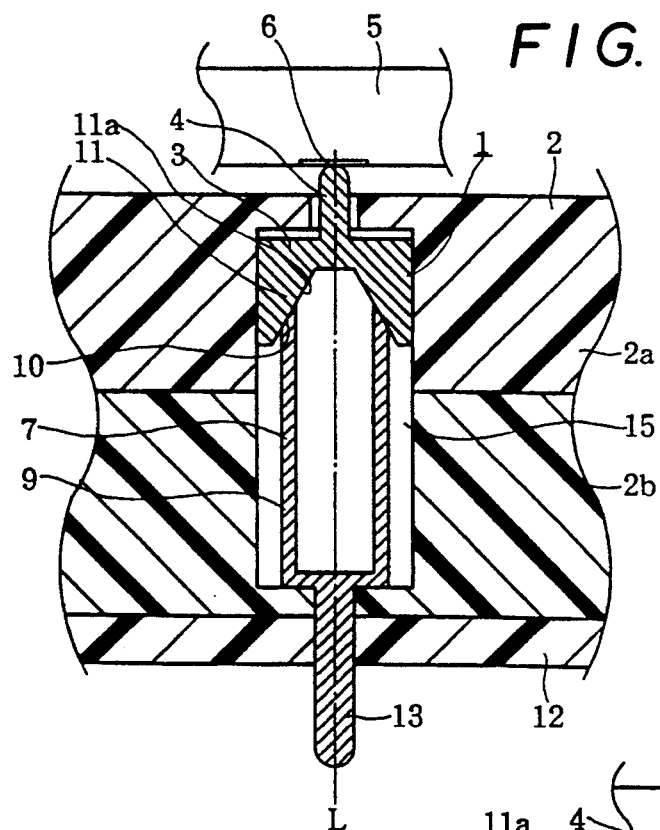
FIG. 11 is a sectional view of an important part of a connector incorporated with a contactor for an electric part according to a sixth embodiment of the present invention.
Figure 12:
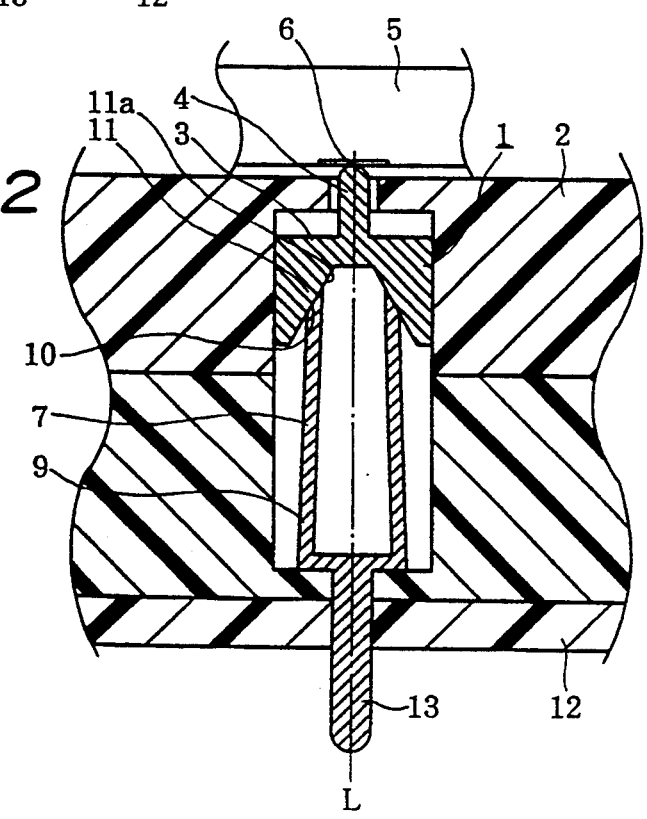
FIG. 12 is a sectional view of the sixth embodiment, showing a press contacted state with the electric part.

Next, FIGS. 11 and 12 show an embodiment in which the movable contactor 13 is provided with the pressing portion 11, and the stationary contactor 9 is provided with the pressure bearing elements 7. As illustrated, the stationary contactor 9 is provided with a plurality of pressure bearing elements 7 extending in opposing parallel relation and in equal length with each other. Lower ends of the mutually opposing pressure bearing elements 7 are connected with each other, and upper ends thereof are left as free ends. The lower end connection portion is provided with the male terminal 13, adapted to be connected to the wiring board 12, and the free ends of the pressure bearing elements 7 are provided with respective tapered portions 10 in the manner as previously mentioned.

On the other hand, the movable contactor 3 having the press contacting portion 4 adapted to be press contacted with the contact 6 of the electric part 5 is formed, and provided with the pressing portion 11 adapted to close the free ends of the pressure bearing elements 7 against the elasticity thereof. The pressing portion 11 has the cone-shaped inclination surface 11a to be abutted with the tapered portions 10 formed on the free ends of the pressure bearing elements 7 in the same manner as previously mentioned.

Pushing down the press contacting portion 4 of the movable contactor 3 with the contact 6 such as, for example, a conductive pad of the electric part 5 pushes the ends of the pressure bearing elements 7 disposed at the stationary contactor 9 inwardly so as to be closed against the elasticity of the pressure bearing elements 7. The movable contactor 3 is pushed up by the elastic restoring force stored in the pressure bearing elements 7 so that the press contacting portion 4 is contacted with the contact 6 of the electric part 5.

Although not shown, the pressing portion 11 of FIGS. 9 through 12 may be provided with the reversed cone-shaped protrusion 11' as in FIG. 4. The insulating substrate 2, as shown in FIGS. 1 through 12, comprises substrates 2a and 2b placed one upon the other, and the contactor holding hole 15 is formed therein. The stationary contactor 9, or male terminal 13, is implanted by press fitting or inserting it into the contactor holding hole formed in the lower substrate 2b.

The electric part 5 is placed on and contacted with the press contacting portion 4 of the movable contactor 3. When the press contacting portion 4 is pushed down with the contact 6 such as, for example, a conductive pad of the electric part 5, the pressure bearing elements 7 are closed or opened against the elasticity thereof at the pressing portion 11, and the press contacting portion 4 is pushed up along the axis L of the movable contactor 3 by the elastic force stored in the pressure bearing elements 7 so as to be press contacted with the contact 6 of the electric part 5.

Figure 13:
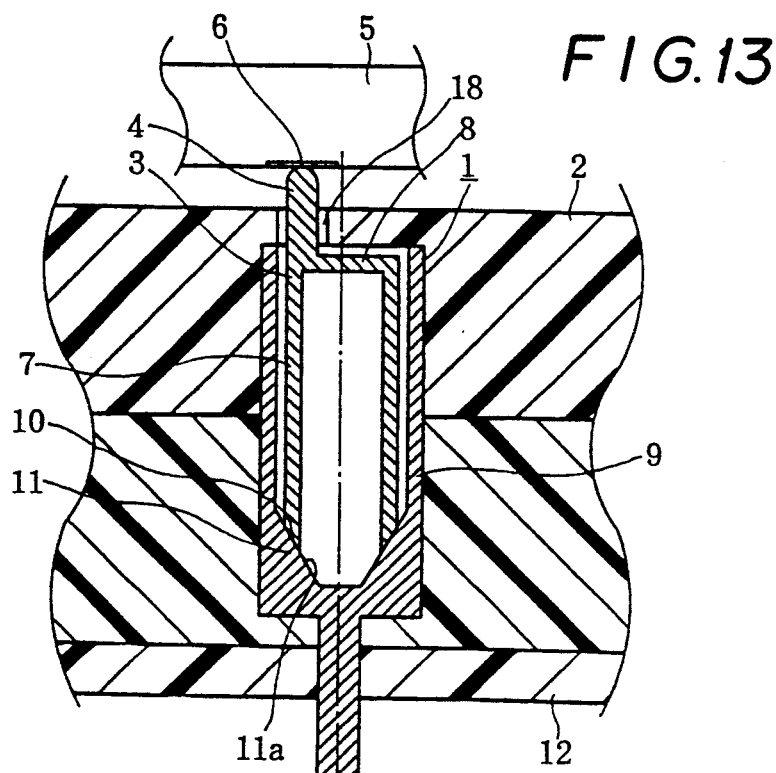
FIG. 13 is a sectional view of an important part of a connector incorporated with a contactor for an electric part according to a seventh embodiment of the present invention.
Figure 14:
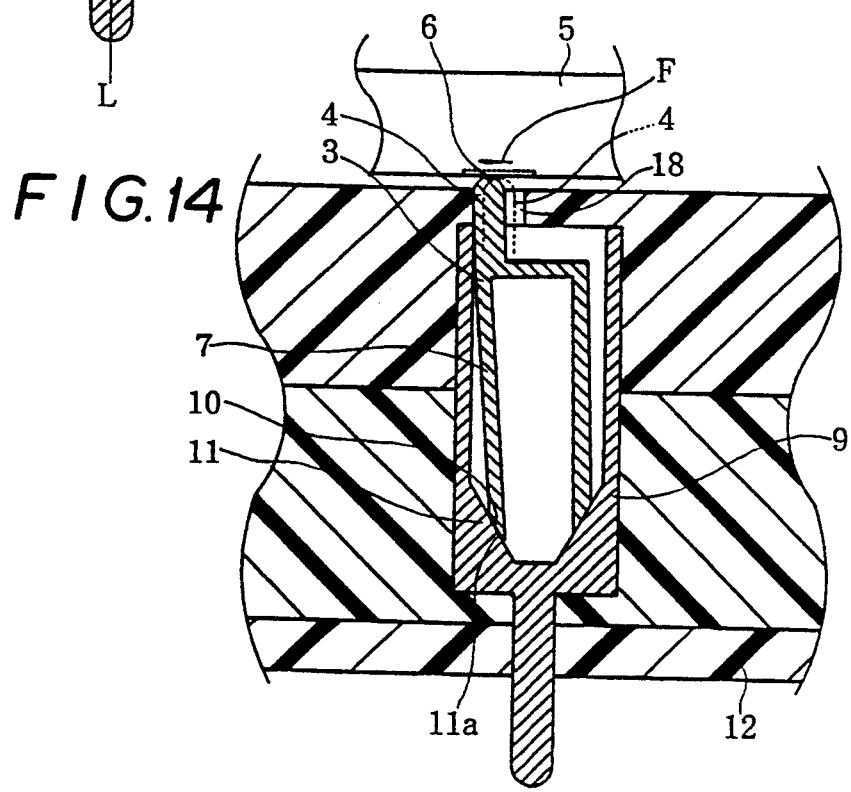
FIG. 14 is a sectional view of the seventh embodiment, showing a press contacted state with the electric part.
Figure 15:
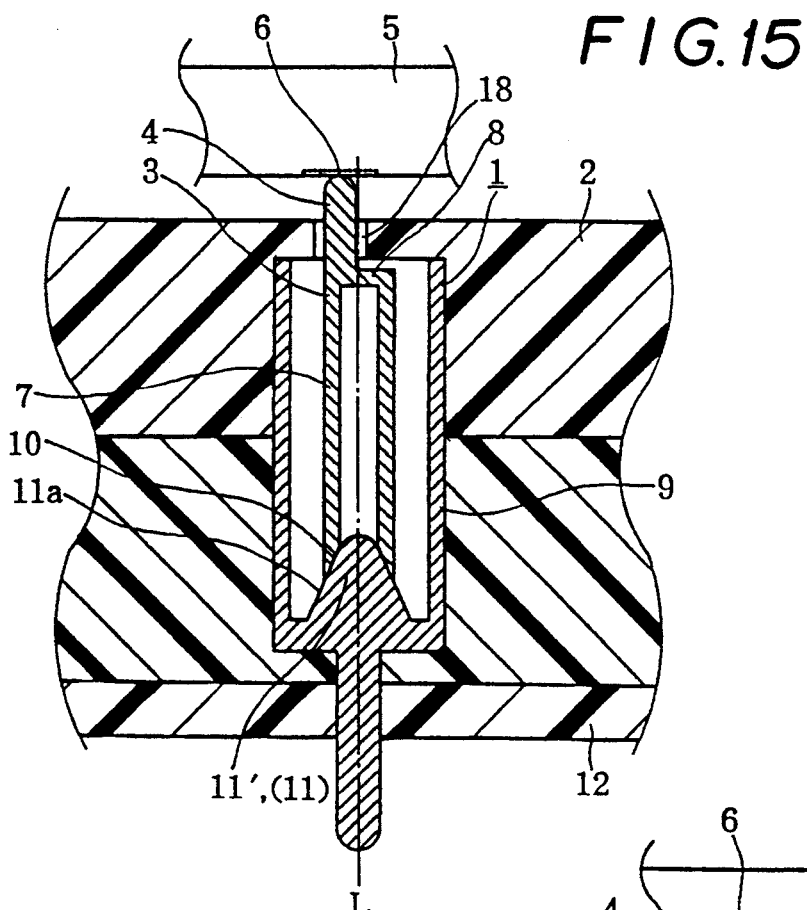
FIG. 15 is a sectional view of an important part of a connector incorporated with a contactor for an electric part according to an eighth embodiment of the present invention.

The embodiments of FIGS. 13 through 22 show several embodiments of a contactor for an electric part which include means for tilting the movable contactor 3 to generate friction between the contact 6 of the electric part 5 and itself when the press contacting portion 4 is pushed down with the contact 6 of the electric part 5, in addition to the press contacting means between the press contacting portion 4 in the above-mentioned contactor and the contact 6 of the electric part 5. FIGS. 13 and 14 show a seventh embodiment, FIGS. 15 and 16, an eighth embodiment, FIGS. 17 and 18, a ninth embodiment, FIGS. 19 and 20, a tenth embodiment, and FIGS. 21 and 22, an eleventh embodiment, respectively.

As shown in FIGS. 13 through 16, the press contacting portion 4 of the movable contactor 3 is formed at an eccentric location, i.e. a location eccentric with respect to the axis L of the movable contactor 3, in such a manner as to be projected therefrom. For example, in order to enhance the tilting of the movable contactor 3, the press contacting portion 4 projects along an extension of one of the pressure bearing elements 7.

Figure 16:
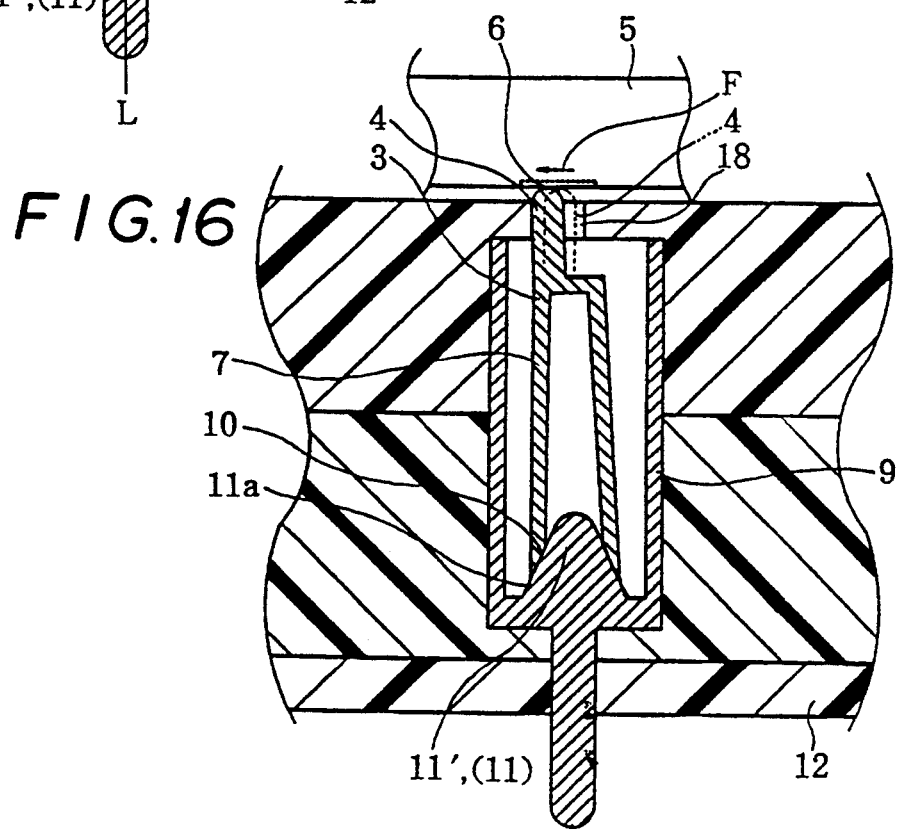
FIG. 16 is a sectional view of the eighth embodiment, showing a press contacted state with the electric part.

As described above, when the press contacting portion 4 is pushed down by the contact 6 such as, for example, the conductive pad 9 of the electric part 5, as shown in FIGS. 14 and 16, the pressure bearing element 7 near the press contacting portion 4 disposed at the eccentric location is pushed by the pressing portion 11 so as to be bent earlier than the pressure bearing portion 7 remote from the press contacting portion 4. When the press contacting portion 4 is further pushed down, the pressure bearing elements 7 are closed or opened against the elasticity thereof, and at the same time the press contacting portion 4 of the movable contactor 3 is tilted toward the eccentric location.

At this time, the press contacting portion 4 is moved in a horizontal direction (the direction as indicated by an arrow F in FIGS. 14 and 16) to rub the contacting surface of the contact 6 of the electric part 5. In other words, the so-called wiping action is taken place to remove the oxide film from the contacting surfaces in order to ensure a clean contact relation.

Figure 17:
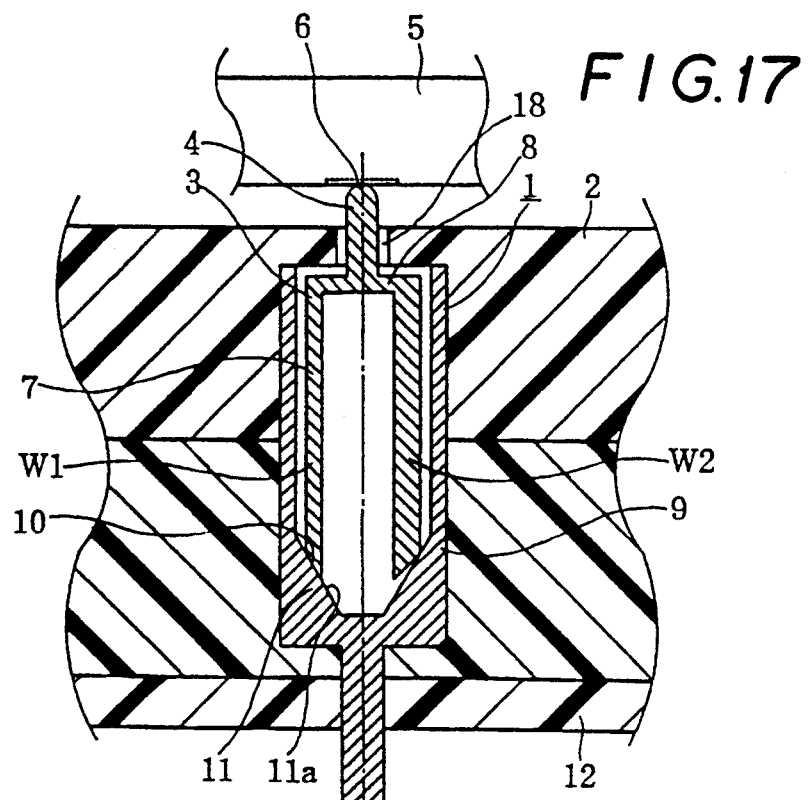
FIG. 17 is a sectional view of an important part of a connector incorporated with a contactor for an electric part according to a ninth embodiment of the present invention.
Figure 18:
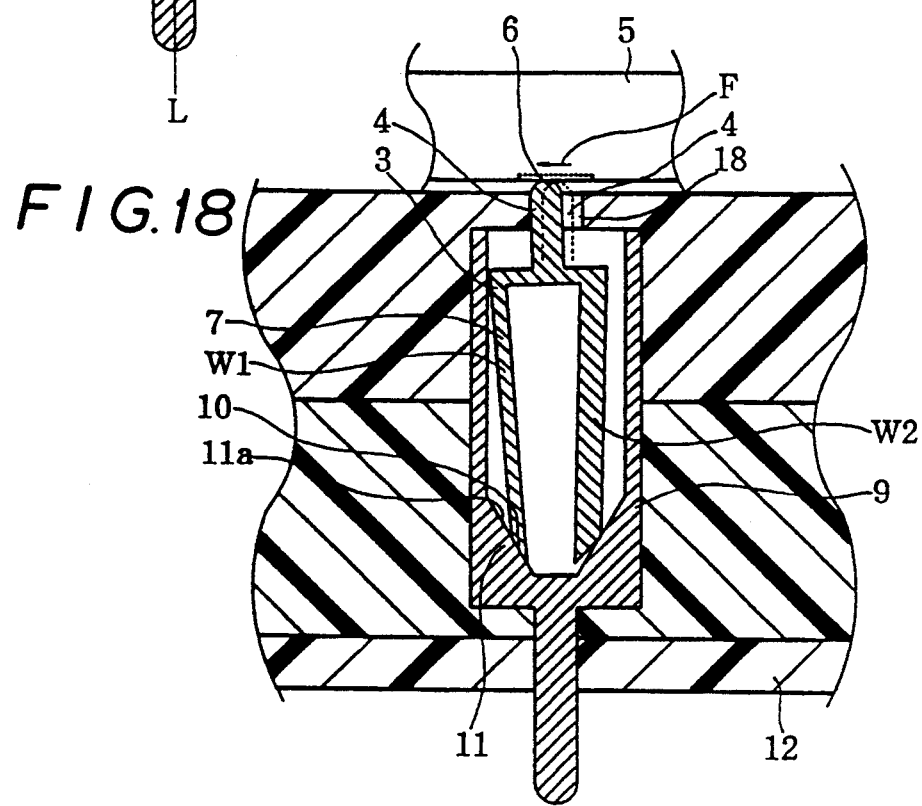
FIG. 18 is a sectional view of the ninth embodiment, showing a press contacted state with the electric part.

In FIGS. 17 through 20, the pressure bearing elements 7 disposed at the movable contactor 3 are different in elastic modulus in order to tilt the movable contactor 3. As a means for making a difference in the elastic modulus, as shown in FIGS. 17 and 18, the pressure bearing elements 7 of the movable contactor 3 are designed to be equal in length and different in thickness in order to make a difference in the elastic modulus. As a concrete example, when the thickness of the pressure bearing element 7 on that side where the movable contactor 3 is tilted is set to W1, the thickness W2 of the other pressure bearing element 7 is thicker than the thickness W1 of the first-mentioned pressure bearing element 7, so that the pressure bearing element 7 of the thickness W1 is larger in elastic modulus than the pressure bearing element 7 of the thickness W2.

When the press contacting portion 4 of the movable contactor 3 having the pressure bearing elements 7, which are different in thickness as mentioned above, is pushed down by the contact 6 of the electric part 5, the pressure bearing element 7 of the thickness W1 (i.e., the thinner pressure bearing element 7 having the larger elastic modulus) is bent first by the pressing portion 11, and as a result the movable contactor 3 is tilted toward the pressure bearing element 7 of the thickness W1. At this time, the press contacting portion 4 is moved in the horizontal direction (the direction indicated by the arrow F) within a through-hole 18 formed in the insulating substrate 2a to rub the contacting surface of the conductive pad 9 of the electric part 5, thus exhibiting the so-called wiping effect.

As shown in FIGS. 19 and 20, the pressure bearing elements 7 of the movable contactor 3 are designed to be equal in thickness and different in length in order to make the difference in the elastic modulus. For example, if the length of the pressure bearing element 7 at the location where the movable contactor 3 is tilted is represented by S1, the length S2 of the other pressure bearing element 7 is designed to be shorter than the length S1 so that the pressure bearing element of the length S1 will be larger in elastic modulus than the pressure bearing element of the length S2.

On the other hand, the pressing portion 11 is abutted with the tapered portions 10 of the opposing pressure bearing elements 7 such that the angles of inclination of the pressing inclination surfaces 11a are equal to each other.

When the press contacting portion 4 of the movable contactor 3 having the pressure bearing elements 7 of different lengths is pushed down by the contact 6 of the electric part 5, the pressure bearing element 7 of the length S1 (i.e., the pressure bearing element 7 having the larger elastic modulus) is bent first to tilt the movable contactor 3 toward the pressure bearing element 7 of the length S1. At this time, the press contacting portion 4 is moved in the horizontal direction (the direction indicated by the arrow F) within the through-hole 18 formed in the insulating substrate 2a to rub the contacting surface of the contact 6 of the electric part 5 in order to remove the oxide film therefrom.

Figure 21:
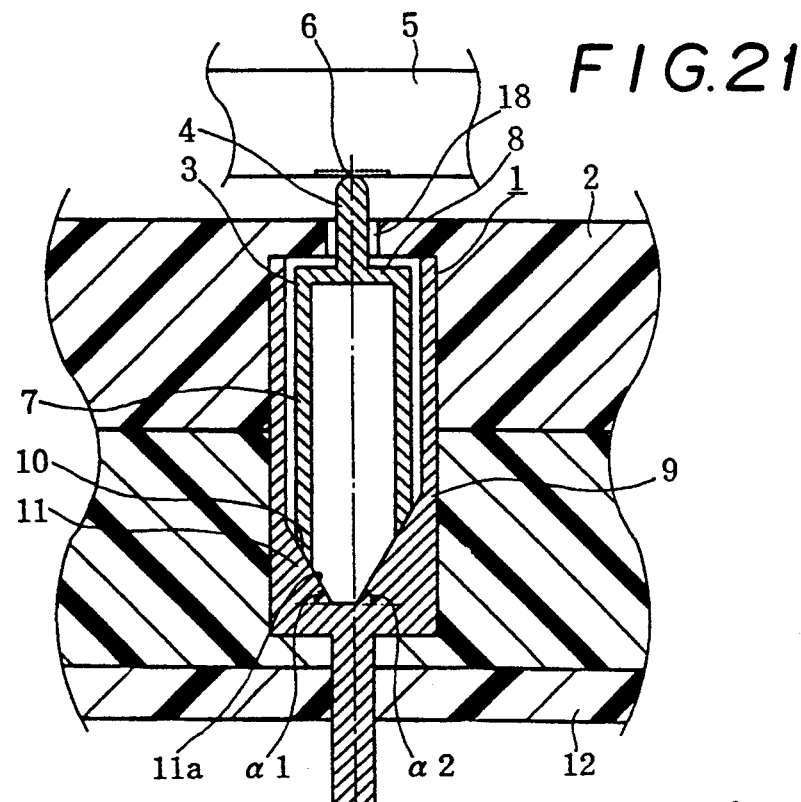
FIG. 21 is a sectional view of an important part of a connector incorporated with a contactor for an electric part according to an eleventh embodiment of the present invention.
Figure 22:
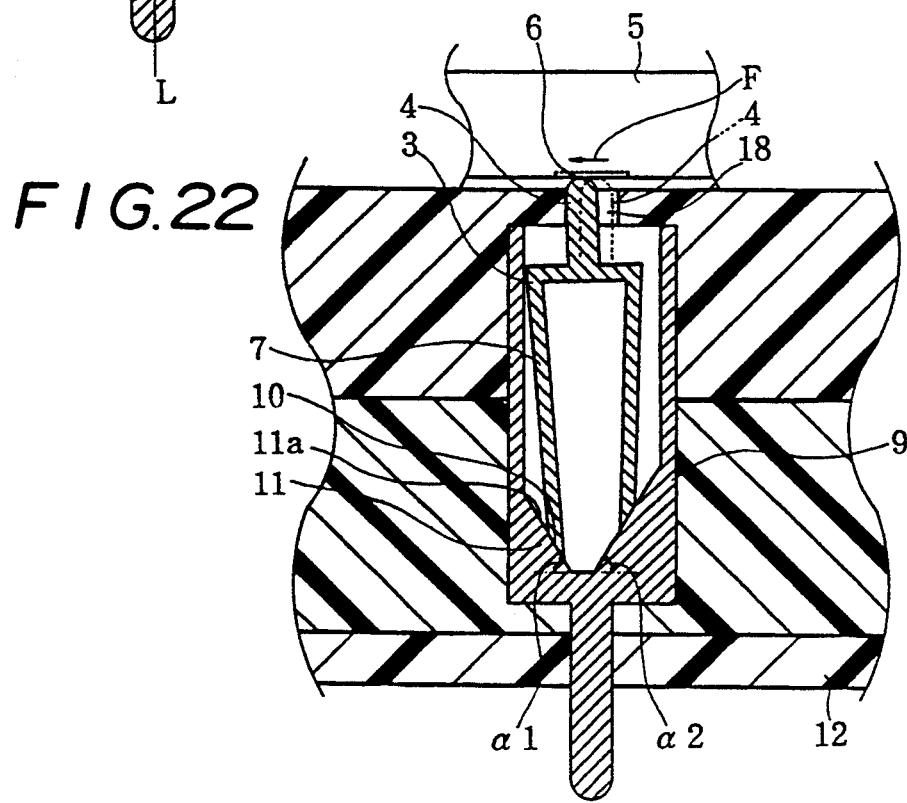
FIG. 22 is a sectional view of the eleventh embodiment, showing a press contacted state with the electric part.

In FIGS. 21 and 22, the inclination surfaces 11a of the pressing portion 11 are set to be different with respect to the pressure bearing elements 7 of the movable contactor 3 so that the movable contactor 3 will be tilted. For example, if the inclination angle of the inclination surface 11a of the pressing portion 11 at the location where the movable contactor 3 is tilted is represented by $\alpha 1$, the inclination angle $\alpha 2$ of the other inclination surface 11a of the pressing portion 11 is set to be smaller than the inclination angle $\alpha 1$.

When the press contacting portion 4 of the movable contactor 3 having the pressing portion 11 which is different in inclination angle of the pressing inclination surfaces, is pushed down by the contact 6 of the electric part 5, the pressure bearing element 7 to be abutted with the pressing portion 11 having the larger inclination angle $\alpha 1$ at the location where the movable contactor 3 is tilted is bent earlier than the other pressure bearing element 7 in order to tilt the movable contactor 3 toward the pressure bearing element having the pressing portion 11 of the larger inclination angle. At this time, the press contacting portion 4 is moved in the horizontal direction (the direction indicated by the arrow F) within the through-hole 18 formed in the insulating substrate 2a to rub the contacting surface of the contact 6 of the electric part 5. As a result, the oxide film is removed from the contacting surfaces, and a clean contact relation can be obtained.

As described above, in any of the embodiments shown in FIGS. 13 through 22, the movable contactor 3 is closed and opened by the pressing portion 11 and normally exhibits the press contacting function with respect to the contact 6 of the electric part 5 by the pressure bearing elements 7 storing elastic force. At the same time, the movable contactor 3 is tilted, and the press contacting portion 4 is moved in the horizontal direction (the direction indicated by the arrow F) while rubbing the surface of the contact 6 of the electric part 5 in order to remove the oxide film covering the contacting surfaces of the press contacting portion 4 and contact 6.

According to the present invention, when the movable contactor is pushed down by a contact such as a conductive pad of an electric part placed on and contacted with the press contacting portion, the pressure bearing elements disposed at this movable contactor are bent against the elastic force thereof by the pressing portion, and the press contacting portion is caused to push up the contact of the electric part by the elastic force stored in the pressure bearing elements. As a result, a proper pressing contact can be obtained. Therefore, there can be provided a highly reliable contactor for an electric part which stably functions without using a coil spring as in the prior art. In addition, the number of parts can be reduced.

Furthermore, according to the present invention, by the elastic force stored in the pressure bearing elements of the movable contactor there can be obtained the above-mentioned action in which the press contacting portion is caused to push up the contact of the electric part to ensure a proper pressing contact. At the same time, the movable contactor, which is in press contact with the contact of the electric part, is tilted to generate friction between the contact of the electric part and the press contacting portion. As a result, the oxide film covering the contacting surfaces can be favorably removed. As a consequence, a highly reliable contacting relation can be obtained between the press contacting portion and the contact of the electric part.

What is claimed is:

1. A contactor for an electric part, comprising:
   a movable contactor having a press contacting portion for pressure contact with a contact of an electric part and a plurality of facing pressure bearing elements extending opposite to each other and having first ends connected to said press contacting portion and opposite free ends that are resiliently movable toward and away from each other; and
   a pressing portion engaging said opposite free ends and having a structure such that movement of said press contacting portion toward said pressing portion causes said facing pressure bearing elements, having said opposite free ends engaging said pressing portion, to be resiliently deformed and give a bias to said press contacting portion in a direction away from said pressing portion such that a pressure contact can be achieved between said press contacting portion and an electric part;
   wherein said press contacting portion, said facing pressure bearing elements and said pressing portion are provided with a structural arrangement that causes said movable contactor to tilt in response to the movement of said press contacting portion toward said pressing portion by a contact of the electric part pressing said press contacting portion so that a wiping action can be generated between said press contacting portion and the contact of the electric part.

2. The contactor of claim 1, wherein said structural arrangement comprises said press contacting portion being eccentrically connected to said first ends of said facing pressure bearing elements.

3. The contactor of claim 2, wherein said facing pressure bearing elements are circumferentially distributed about a longitudinal center axis parallel thereto, said press contacting portion being aligned with one said facing pressure bearing element.

4. The contactor of claim 1 wherein said structural arrangement comprises said facing pressure bearing elements being provided with different moduli of elasticity.

5. The contactor of claim 4, wherein said movable contactor tilts toward said facing pressure bearing element having the largest modulus of elasticity.

6. The contactor of claim 4, wherein said facing pressure bearing elements have different thicknesses.

7. The contactor of claim 4, wherein said facing pressure bearing elements have different lengths.

8. The contactor of claim 1, wherein said structural arrangement comprises said pressing portion having angled pressing surfaces engaging said free ends of said facing pressure bearing elements at different angles to said facing pressure bearing elements.

9. The contactor of claim 1, wherein said pressing portion has angled pressing surfaces engaging said free ends of said facing pressure bearing elements.

10. A contactor for an electric part, comprising:
    a substrate;
    a first contactor movably mounted in said substrate, said first contactor having a press contacting portion for pressure contact with an electric part contact;
    a second contactor fixed in said substrate; and
    a means for resiliently engaging said first contactor with said second contactor such that said press contacting portion is biased toward the electric part contact when the electric part contact presses on said press contacting portion and for causing said first contactor to tilt in response to movement of said press contacting portion toward said second contactor by the electric part contact pressing said press contacting portion so that a wiping action is generated between said press contacting portion and the electric part contact, said means including a plurality of facing pressure bearing elements extending opposite to each other and having first ends connected to one of said first and second contactors and opposite free ends that are resiliently movable toward and away from each other, and a pressing portion connected to the other of said first and second contactors engaging said opposite free ends of said facing pressure bearing elements.

11. The contactor of claim 10, wherein said means further comprises said press contacting portion being eccentrically connected to said first ends of said facing pressure bearing elements.

12. The contactor of claim 11, wherein said facing pressure bearing elements are circumferentially distributed about a longitudinal center axis parallel thereto, said press contacting portion being aligned with one said facing pressure bearing element.

13. The contactor of claim 10, wherein said means further comprises said facing pressure bearing elements being provided with different moduli of elasticity.

14. The contactor of claim 13, wherein said first contactor tilts toward said facing pressure bearing element having the largest modulus of elasticity.

15. The contactor of claim 13, wherein said facing pressure bearing elements have different thicknesses.

16. The contactor of claim 13, wherein said facing pressure bearing elements have different lengths.

17. The contactor of claim 10, wherein said means further comprises said pressing portion having angled pressing surfaces engaging said free ends of said facing pressure bearing elements at different angles with respect to said facing pressure bearing elements.

18. The contactor of claim 10, wherein said pressing portion has angled pressing surfaces engaging said free ends of said facing pressure bearing elements.

* * * * *